United States Patent
Chen et al.

(10) Patent No.: US 12,394,887 B2
(45) Date of Patent: Aug. 19, 2025

(54) ELECTRONIC DEVICE ANTENNAS WITH NARROW BORDER DISPLAY

(71) Applicant: Apple Inc., Cupertino, CA (US)

(72) Inventors: Ming Chen, Cupertino, CA (US); Enrique Ayala Vazquez, Watsonville, CA (US); Joel Ravi, San Francisco, CA (US); Woonyong Bae, San Jose, CA (US); Laura M Burke, Los Gatos, CA (US); Yuancheng Xu, San Jose, CA (US); Bhaskara R Rupakula, San Jose, CA (US); Haozhan Tian, San Jose, CA (US); Salih Yarga, San Jose, CA (US); Erdinc Irci, Sunnyvale, CA (US); Tiejun Yu, Fremont, CA (US); Seyed Mohammad Amjadi, Santa Clara, CA (US); Ahmed Ali Abdelhaliem Nafe, Cupertino, CA (US); Hongfei Hu, Cupertino, CA (US); Carlo Di Nallo, Belmont, CA (US); Mattia Pascolini, San Francisco, CA (US)

(73) Assignee: Apple Inc., Cupertino, CA (US)

(*) Notice: Subject to any disclaimer, the term of this patent is extended or adjusted under 35 U.S.C. 154(b) by 70 days.

(21) Appl. No.: 18/465,014

(22) Filed: Sep. 11, 2023

(65) Prior Publication Data
US 2025/0087869 A1    Mar. 13, 2025

(51) Int. Cl.
*H01Q 1/24* (2006.01)
*H05K 5/02* (2006.01)

(52) U.S. Cl.
CPC ........... *H01Q 1/243* (2013.01); *H05K 5/0247* (2013.01)

(58) Field of Classification Search
None
See application file for complete search history.

(56) References Cited

U.S. PATENT DOCUMENTS 9,293,816 B2 * 3/2016 Samardzija .......... H01Q 9/0407
10,187,974 B2   1/2019 Qian
(Continued)

FOREIGN PATENT DOCUMENTS

CN    107887696 A    4/2018
CN    114006960 A    2/2022
(Continued)

*Primary Examiner* — Wilson Lee
(74) *Attorney, Agent, or Firm* — Treyz Law Group, P.C.; Michael H. Lyons

(57) ABSTRACT

An electronic device may be provided with sidewalls and a conductive plate. A segment of the sidewalls may form a radiating arm of an antenna. A display may be mounted to the sidewalls. The display may include a conductive frame and a flexible printed circuit. The flexible circuit may have a bend. Conductive foam may short a conductive trace on the flexible circuit to the conductive frame near the bend. Low injection pressure overmolding (LIPO) may be molded over the flexible circuit, the foam, and the frame. A conductive spring may short the frame to the conductive plate. The spring may include a wider and/or thinner portion that optionally includes one or more notches for reducing its inductance. The conductive plate, the spring, the frame, the foam, and the conductive trace may form part of the antenna ground for the antenna.

20 Claims, 8 Drawing Sheets

(56) References Cited

U.S. PATENT DOCUMENTS

| | | |
|---|---|---|
| 10,658,749 B2 | 5/2020 | Ruaro et al. |
| 10,908,654 B2 | 2/2021 | Oster et al. |
| 11,097,096 B2 | 8/2021 | Linden et al. |
| 11,374,322 B2 | 6/2022 | Asaf et al. |
| 11,405,493 B2 | 8/2022 | Jung et al. |
| 11,594,815 B2 * | 2/2023 | Irci ..................... H04M 1/026 |
| 2022/0085488 A1 * | 3/2022 | Irci ..................... H01Q 1/2291 |
| 2022/0320708 A1 | 10/2022 | Hojo et al. |
| 2022/0352635 A1 * | 11/2022 | Compton ............... H05K 1/028 |
| 2023/0101080 A1 * | 3/2023 | Lee ....................... H01Q 1/243 |
| | | 343/702 |

FOREIGN PATENT DOCUMENTS

| | | |
|---|---|---|
| KR | 20190029437 A | 3/2019 |
| KR | 102481932 B1 | 12/2022 |
| WO | 2022191535 A1 | 9/2022 |

\* cited by examiner

ELECTRONIC DEVICE ANTENNAS WITH NARROW BORDER DISPLAY

FIELD

This relates generally to electronic devices, including electronic devices with wireless communications capabilities.

BACKGROUND

Electronic devices such as portable computers and cellular telephones are often provided with wireless communications capabilities and displays. To satisfy consumer demand for small form factor wireless devices, manufacturers are continually striving to implement wireless communications circuitry such as antenna components using compact structures. At the same time, there is a desire for wireless devices to cover a growing number of communications bands. In addition, to optimize user experience, it is often desirable for the viewing area of a display in an electronic device to be as large as possible.

Because antennas have the potential to interfere with each other and with components in a wireless device such as displays, care must be taken when incorporating antennas into an electronic device. Moreover, care must be taken to ensure that the antennas and wireless circuitry in a device are able to exhibit satisfactory performance over a range of operating frequencies and with satisfactory efficiency bandwidth.

SUMMARY

An electronic device may be provided with wireless circuitry and a housing. The housing may include peripheral conductive housing structures and a conductive plate extending between opposing walls of the peripheral conductive housing structures. The conductive plate may be separated from a segment of the peripheral conductive housing structures by a slot. The segment may form a radiating arm for an antenna in the wireless circuitry.

A display may be mounted to the peripheral conductive housing structures. The display may include a conductive frame and a folded flexible printed circuit mounted to the conductive frame. The flexible printed circuit may have a bend at which the flexible printed circuit is folded around an axis. The bend may face the segment of the peripheral conductive housing structures. Conductive foam may short a conductive trace on the flexible printed circuit to the conductive frame adjacent the fold in the flexible printed circuit. Low injection pressure overmolding (LIPO) may be molded over the flexible printed circuit at the bend, the conductive foam, and the conductive frame.

A conductive spring may short the conductive frame to the conductive plate. The conductive spring may be folded about three axes. The conductive spring may include a wider and/or thinner portion that optionally includes one or more notches for reducing the inductance of the spring. The conductive plate, the conductive spring, the conductive frame, the conductive foam, and the conductive trace may form part of the antenna ground for the antenna. The conductive foam may prevent electromagnetic interference between the display and the antenna. The flexible printed circuit may be disposed relatively close to the segment, thereby maximizing the active area of the display.

DETAILED DESCRIPTION

Figure 1:
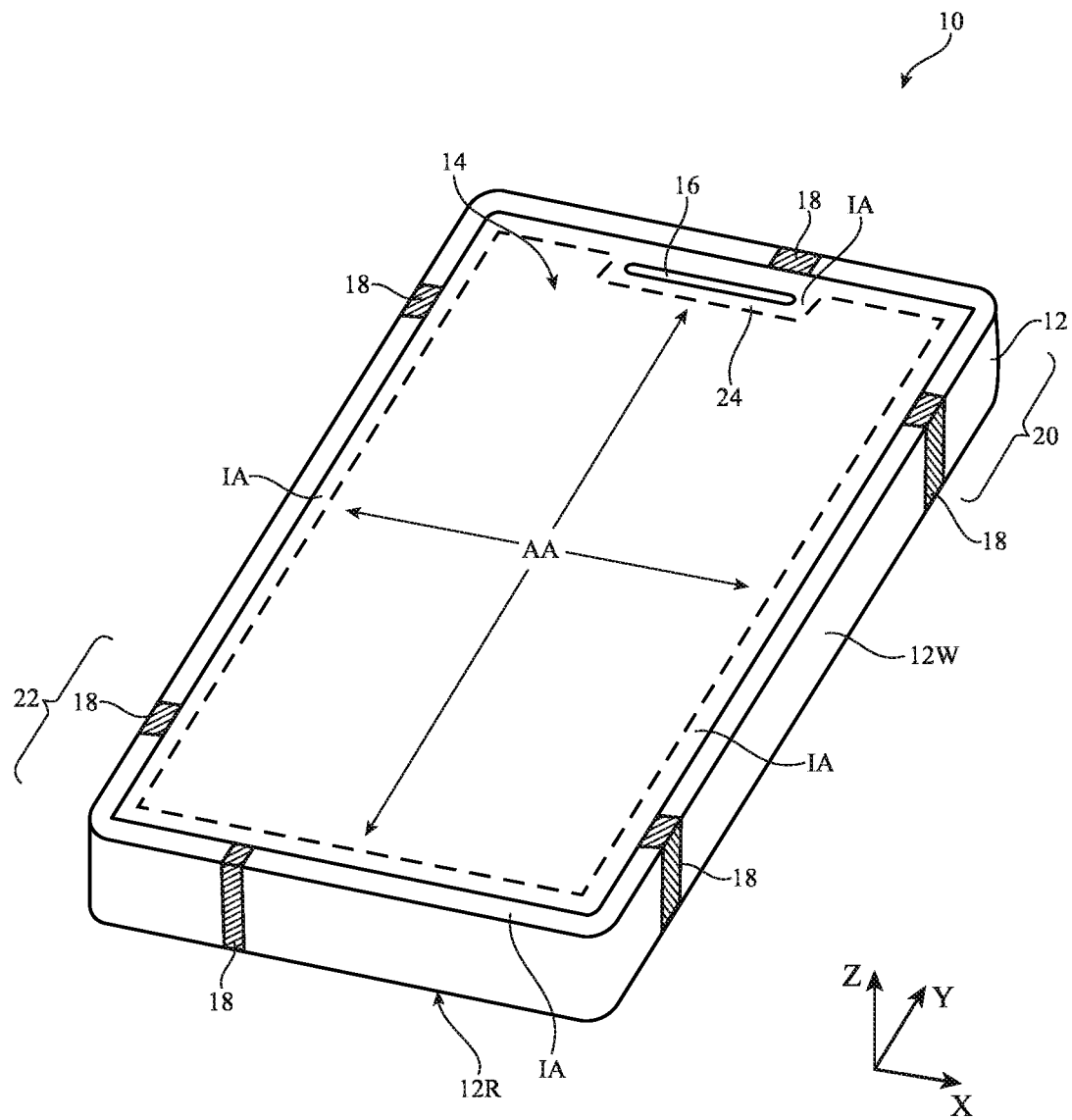
FIG. 1 is a perspective view of an illustrative electronic device in accordance with some embodiments.

An electronic device such as electronic device 10 of FIG. 1 may be provided with wireless circuitry that includes antennas. The antennas may be used to transmit and/or receive wireless radio-frequency signals.

Device 10 may be a portable electronic device or other suitable electronic device. For example, device 10 may be a laptop computer, a tablet computer, a somewhat smaller device such as a wrist-watch device, pendant device, headphone device, earpiece device, headset device (e.g., virtual, augmented, or mixed reality glasses or goggles), or another wearable or miniature device, a handheld device such as a cellular telephone, a media player, or another small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic (e.g., a dielectric cover layer). Housing 12 may also have shallow grooves that do not pass entirely through housing 12. The slots and grooves may be filled with plastic or other dielectric materials. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). In other words, device 10 may have a length (e.g., measured parallel to the Y-axis), a width that is less than the length (e.g., measured parallel to the X-axis), and a height (e.g., measured parallel to the Z-axis) that is less than the width. Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed from a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, alloys, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating/cover layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region such as notch 24 that extends into active area AA. Active area AA may, for example, be defined by the lateral area of a display module for display 14 (e.g., a display module that includes pixel circuitry, touch sensor circuitry, etc.). The display module may have a recess or notch in upper region 20 of device 10 that is free from active display circuitry (i.e., that forms notch 24 of inactive area IA). Notch 24 may be a substantially rectangular region that is surrounded (defined) on three sides by active area AA and on a fourth side by peripheral conductive housing structures 12W. Alternatively, notch 24 may be defined on all sides by (e.g., may be surrounded and enclosed by) active area AA (e.g., notch 24 may form an inactive island in the pixel circuitry of display 14). One or more sensors may be aligned with notch 24 and may transmit and/or receive light through display 14 within notch 24.

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 in notch 24 or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a conductive support plate or backplate) that spans the walls of housing 12 (e.g., a substantially rectangular sheet formed from one or more metal parts that is welded or otherwise connected between opposing sides of peripheral conductive housing structures 12W). The conductive support plate may form an exterior rear surface of device 10 or may be covered by a dielectric cover layer such as a thin cosmetic layer, protective coating, and/or other coatings that may include dielectric materials such as glass, ceramic, plastic, or other structures that form the exterior surfaces of device 10 and/or serve to hide the conductive support plate from view of the user (e.g., the conductive support plate may form part of rear housing wall 12R). Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20. Region 22 may sometimes be referred to herein as lower region 22 or lower end 22 of device 10. Region 20 may sometimes be referred to herein as upper region 20 or upper end 20 of device 10.

In general, device 10 may include any suitable number of antennas (e.g., one or more, two or more, three or more, four or more, etc.). The antennas in device 10 may be located at opposing first and second ends of an elongated device housing (e.g., at lower region 22 and/or upper region 20 of device 10 of FIG. 1), along one or more edges of a device housing, in the center of a device housing, in other suitable locations, or in one or more of these locations. The arrangement of FIG. 1 is illustrative and non-limiting.

Portions of peripheral conductive housing structures 12W may be provided with peripheral gap structures. For example, peripheral conductive housing structures 12W may be provided with one or more dielectric-filled gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14.

To provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas. An upper antenna may, for example, be formed in upper region 20 of device 10. A lower antenna may, for example, be formed in lower region 22 of device 10. Additional antennas may be formed along the edges of housing 12 extending between regions 20 and 22 if desired. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is illustrative and non-limiting. If desired, housing 12 may have other shapes (e.g., a square shape, cylindrical shape, spherical shape, combinations of these and/or different shapes, etc.).

Figure 2:
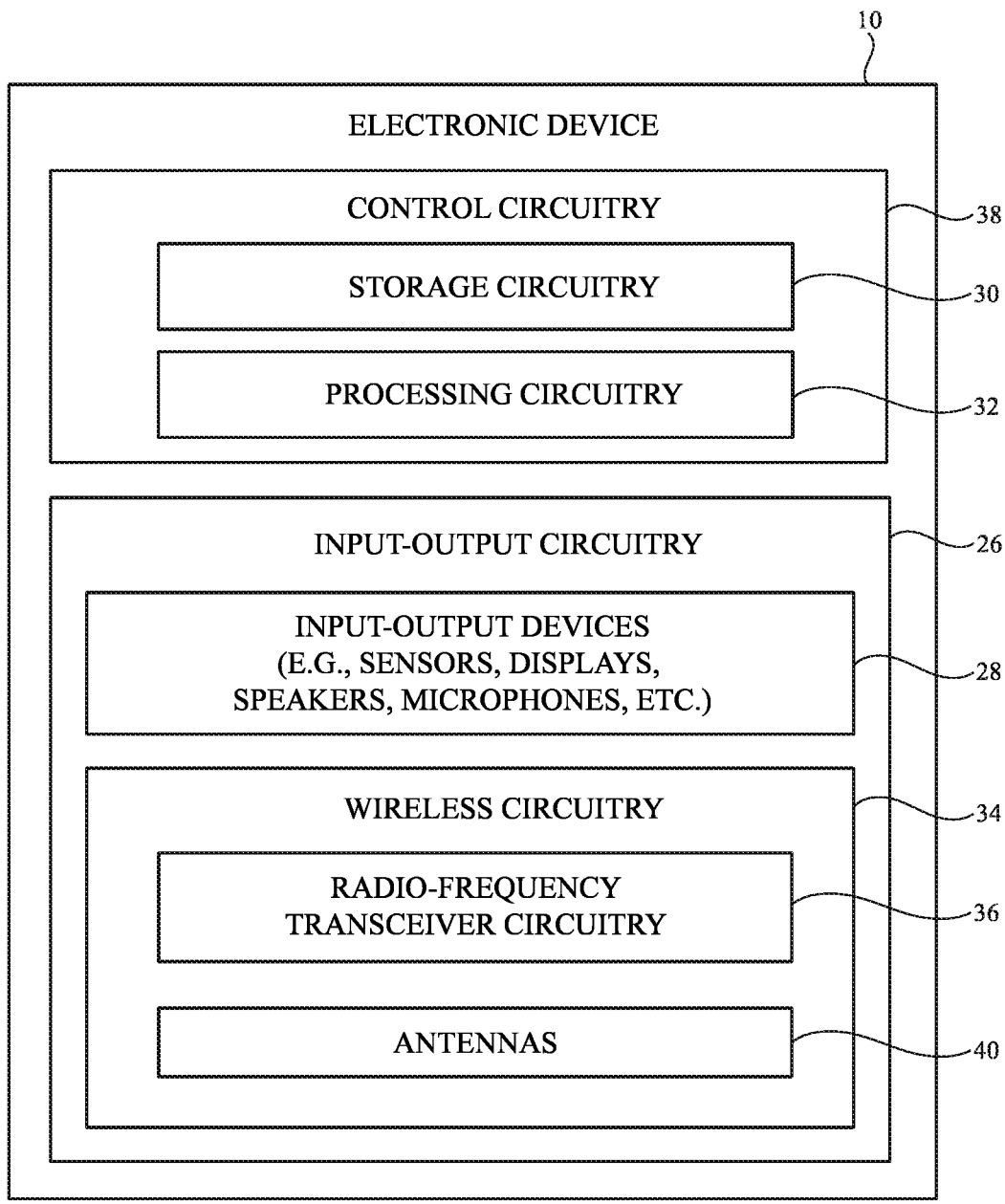
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 38. Control circuitry 38 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 38 may include processing circuitry such as processing circuitry 32. Processing circuitry 32 may be used to control the operation of device 10. Processing circuitry 32 may include one or more processors such as microprocessors, microcontrollers, digital signal processors, host processors, baseband processor integrated circuits, application specific integrated circuits, graphics processing units, central processing units (CPUs), etc. Control circuitry 38 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 38 may be used to run software on device 10 such as internet browsing applications, voice-over-internet-protocol (VOIP) telephone call applications, email applications, media playback applications, operating system functions, etc. To support interactions with external equipment, control circuitry 38 may be used in implementing communications protocols. Communications protocols that may be implemented using control circuitry 38 include internet protocols, wireless local area network protocols (e.g., IEEE 802.11 protocols-sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 26. Input-output circuitry 26 may include input-output devices 28. Input-output devices 28 may be used to allow data to be supplied to device 10 and to allow data to be provided from device 10 to external devices. Input-output devices 28 may include user interface devices, data port devices, sensors, and other input-output components. For example, input-output devices 28 may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components. The sensors in input-output devices 28 may include front-facing sensors that gather sensor data through display 14. The front-facing sensors may be optical sensors. The optical sensors may include an image sensor (e.g., a front-facing camera), an infrared sensor, and/or an ambient light sensor. The infrared sensor may include one or more infrared emitters (e.g., a dot projector and a flood illuminator) and/or one or more infrared image sensors.

Input-output circuitry 26 may include wireless circuitry such as wireless circuitry 34 for wirelessly conveying radio-frequency signals. While control circuitry 38 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 38 (e.g., portions of control circuitry 38 may be implemented on wireless circuitry 34). As an example, control circuitry 38 may include baseband processor circuitry or other control components that form a part of wireless circuitry 34.

Wireless circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless circuitry 34 may include radio-frequency transceiver circuitry 36 for handling transmission and/or reception of radio-frequency signals within corresponding frequency bands at radio frequencies (sometimes referred to herein as communications bands or simply as "bands"). The frequency bands handled by radio-frequency transceiver circuitry 36 may include wireless local area network (WLAN) frequency bands (e.g., Wi-Fi® (IEEE 802.11) or other WLAN communications bands) such as a 2.4 GHZ WLAN band (e.g., from 2400 to 2480 MHZ), a 5 GHZ WLAN band (e.g., from 5180 to 5825 MHZ), a Wi-Fi® 6E band (e.g., from 5925-7125 MHz), and/or other Wi-Fi® bands (e.g., from 1875-5160 MHZ), wireless personal area network (WPAN) frequency bands such as the 2.4 GHZ Bluetooth® band or other WPAN communications bands, cellular telephone communications bands such as a cellular low band (LB) (e.g., 600 to 960 MHZ), a cellular low-midband (LMB) (e.g., 1400 to 1550 MHZ), a cellular midband (MB) (e.g., from 1700 to 2200 MHZ), a cellular high band (HB) (e.g., from 2300 to 2700 MHZ), a cellular ultra-high band (UHB) (e.g., from 3300 to 5000 MHz, or other cellular communications bands between about 600 MHz and about 5000 MHZ), 3G bands, 4G LTE bands, 3GPP 5G New Radio Frequency Range 1 (FR1) bands below 10 GHZ, 3GPP 5G New Radio (NR) Frequency Range 2 (FR2) bands between 20 and 60 GHZ, other centimeter or millimeter wave frequency bands between 10-300 GHZ, near-field communications frequency bands (e.g., at 13.56 MHZ), satellite navigation frequency bands such as the Global Positioning System (GPS) L1 band (e.g., at 1575 MHZ), L2 band (e.g., at 1228 MHZ), L3 band (e.g., at 1381 MH2), L4 band (e.g., at 1380 MHZ), and/or L5 band (e.g., at 1176 MHZ), a Global Navigation Satellite System (GLONASS) band, a BeiDou Navigation Satellite System (BDS) band, ultra-wideband (UWB) frequency bands that operate under the IEEE 802.15.4 protocol and/or other ultra-wideband communications protocols (e.g., a first UWB communications band at 6.5 GHZ and/or a second UWB communications band at 8.0 GHZ), communications bands under the family of 3GPP wireless communications standards, communications bands under the IEEE 802.XX family of standards, satellite communications bands such as an L-band, S-band (e.g., from 2-4 GHZ), C-band (e.g., from 4-8 GHZ), X-band, Ku-band (e.g., from 12-18 GHZ), Ka-band (e.g., from 26-40 GHZ), etc., industrial, scientific, and medical (ISM) bands such as an ISM band between around 900 MHz and 950 MHz or other ISM bands below or above 1 GHZ, one or more unlicensed bands, one or more bands reserved for emergency and/or public services, and/or any other desired frequency bands of interest. Wireless circuitry 34 may also be used to perform spatial ranging operations if desired.

The UWB communications handled by radio-frequency transceiver circuitry 36 may be based on an impulse radio signaling scheme that uses band-limited data pulses. Radio-frequency signals in the UWB frequency band may have any desired bandwidths such as bandwidths between 499 MHz and 1331 MHz, bandwidths greater than 500 MHZ, etc. The presence of lower frequencies in the baseband may sometimes allow ultra-wideband signals to penetrate through objects such as walls. In an IEEE 802.15.4 system, for example, a pair of electronic devices may exchange wireless time stamped messages. Time stamps in the messages may be analyzed to determine the time of flight of the messages and thereby determine the distance (range) between the devices and/or an angle between the devices (e.g., an angle of arrival of incoming radio-frequency signals).

Radio-frequency transceiver circuitry 36 may include respective transceivers (e.g., transceiver integrated circuits or chips) that handle each of these frequency bands or any desired number of transceivers that handle two or more of these frequency bands. In scenarios where different transceivers are coupled to the same antenna, filter circuitry (e.g., duplexer circuitry, diplexer circuitry, low pass filter circuitry, high pass filter circuitry, band pass filter circuitry, band stop filter circuitry, etc.), switching circuitry, multiplexing circuitry, or any other desired circuitry may be used to isolate radio-frequency signals conveyed by each transceiver over the same antenna (e.g., filtering circuitry or multiplexing circuitry may be interposed on a radio-frequency transmission line shared by the transceivers). Radio-frequency transceiver circuitry 36 may include one or more integrated circuits (chips), integrated circuit packages (e.g., multiple integrated circuits mounted on a common printed circuit in a system-in-package device, one or more integrated circuits mounted on different substrates, etc.), power amplifier circuitry, up-conversion circuitry, down-conversion circuitry, low-noise input amplifiers, passive radio-frequency components, switching circuitry, transmission line structures, and other circuitry for handling radio-frequency signals and/or for converting signals between radio-frequencies, intermediate frequencies, and/or baseband frequencies.

In general, radio-frequency transceiver circuitry 36 may cover (handle) any desired frequency bands of interest. As shown in FIG. 2, wireless circuitry 34 may include antennas 40. Radio-frequency transceiver circuitry 36 may convey radio-frequency signals using one or more antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

Antennas 40 in wireless circuitry 34 may be formed using any suitable antenna structures. For example, antennas 40 may include antennas with resonating elements that are formed from stacked patch antenna structures, loop antenna structures, patch antenna structures, inverted-F antenna structures, slot antenna structures, planar inverted-F antenna structures, waveguide structures, monopole antenna structures, dipole antenna structures, helical antenna structures, Yagi (Yagi-Uda) antenna structures, hybrids of these designs, etc. If desired, antennas 40 may include antennas with dielectric resonating elements such as dielectric resonator antennas. If desired, one or more of antennas 40 may be cavity-backed antennas. Two or more antennas 40 may be arranged in a phased antenna array if desired (e.g., for conveying centimeter and/or millimeter wave signals within a signal beam formed in a desired beam pointing direction that may be steered/adjusted over time). Different types of antennas may be used for different bands and combinations of bands.

Figure 3:
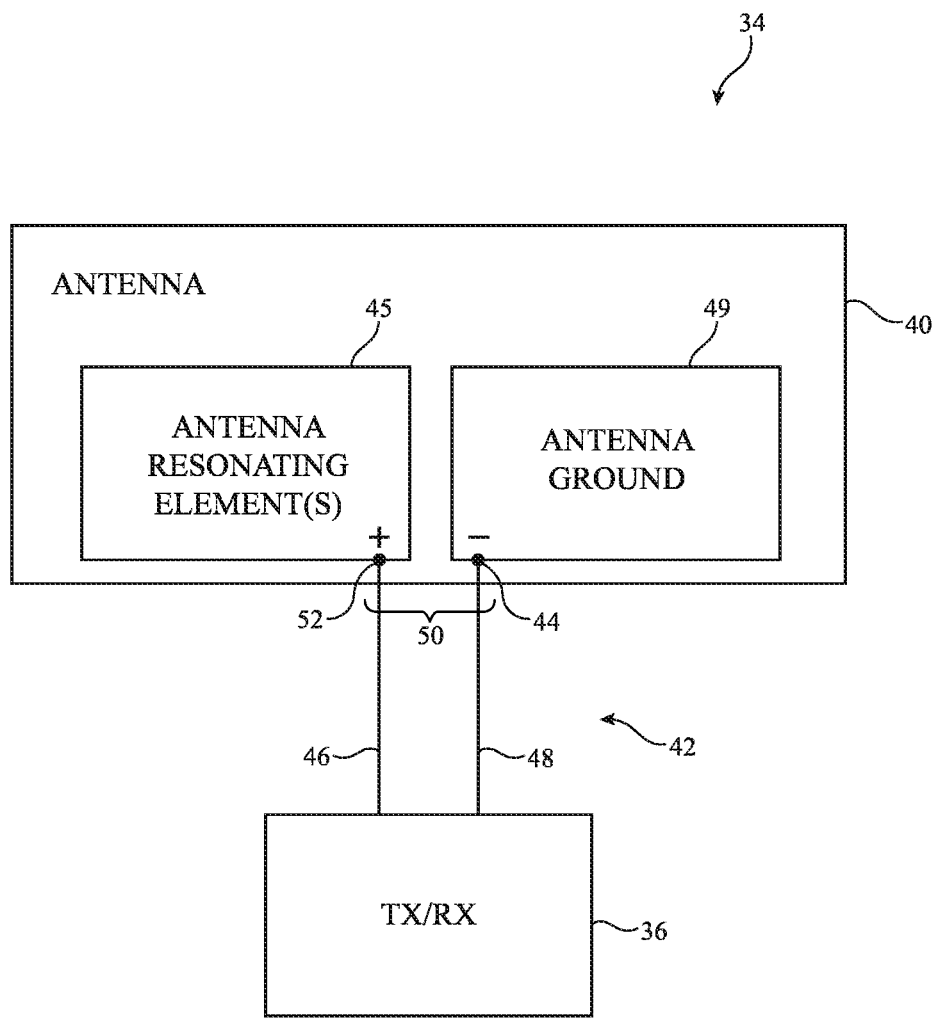
FIG. 3 is a schematic diagram of illustrative wireless circuitry in accordance with some embodiments.

FIG. 3 is a schematic diagram showing how a given antenna 40 may be fed by radio-frequency transceiver circuitry 36. As shown in FIG. 3, antenna 40 may have a corresponding antenna feed 50. Antenna 40 may include one or more antenna resonating (radiating) elements 45 and an antenna ground 49. Antenna resonating element(s) 45 may include one or more radiating arms, slots, waveguides, dielectric resonators, patches, parasitic elements, indirect feed elements, and/or any other desired antenna radiators. Antenna feed 50 may include a positive antenna feed terminal 52 coupled to at least one antenna resonating element 45 and a ground antenna feed terminal 44 coupled to antenna ground 49. If desired, one or more conductive paths (sometimes referred to herein as ground paths, short paths, or return paths) may couple antenna resonating element(s) 45 to antenna ground 49.

Radio-frequency transceiver (TX/RX) circuitry 36 may be coupled to antenna feed 50 using a radio-frequency transmission line path 42 (sometimes referred to herein as transmission line path 42). Transmission line path 42 may include a signal conductor such as signal conductor 46 (e.g., a positive signal conductor). Transmission line path 42 may include a ground conductor such as ground conductor 48. Ground conductor 48 may be coupled to ground antenna feed terminal 44 of antenna feed 50. Signal conductor 46 may be coupled to positive antenna feed terminal 52 of antenna feed 50.

Transmission line path 42 may include one or more radio-frequency transmission lines. The radio-frequency transmission line(s) in transmission line path 42 may include stripline transmission lines (sometimes referred to herein simply as striplines), coaxial cables, coaxial probes realized by metalized vias, microstrip transmission lines, edge-coupled microstrip transmission lines, edge-coupled stripline transmission lines, waveguide structures, combinations of these, etc. Multiple types of radio-frequency transmission line may be used to form transmission line path 42. Filter circuitry, switching circuitry, impedance matching circuitry, phase shifter circuitry, amplifier circuitry, and/or other circuitry may be interposed on transmission line path 42, if desired. One or more antenna tuning components for adjusting the frequency response of antenna 40 in one or more bands may be interposed on transmission line path 42 and/or may be integrated within antenna 40 (e.g., coupled between the antenna ground and the antenna resonating element of antenna 40, coupled between different portions of the antenna resonating element of antenna 40, etc.).

If desired, one or more of the radio-frequency transmission lines in transmission line path 42 may be integrated into ceramic substrates, rigid printed circuit boards, and/or flexible printed circuits. In one suitable arrangement, the radio-frequency transmission lines may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All the multiple layers of the laminated structures may be batch laminated together (e.g., in a single pressing process) without adhesive (e.g., as opposed to performing multiple pressing processes to laminate multiple layers together with adhesive).

Figure 4:
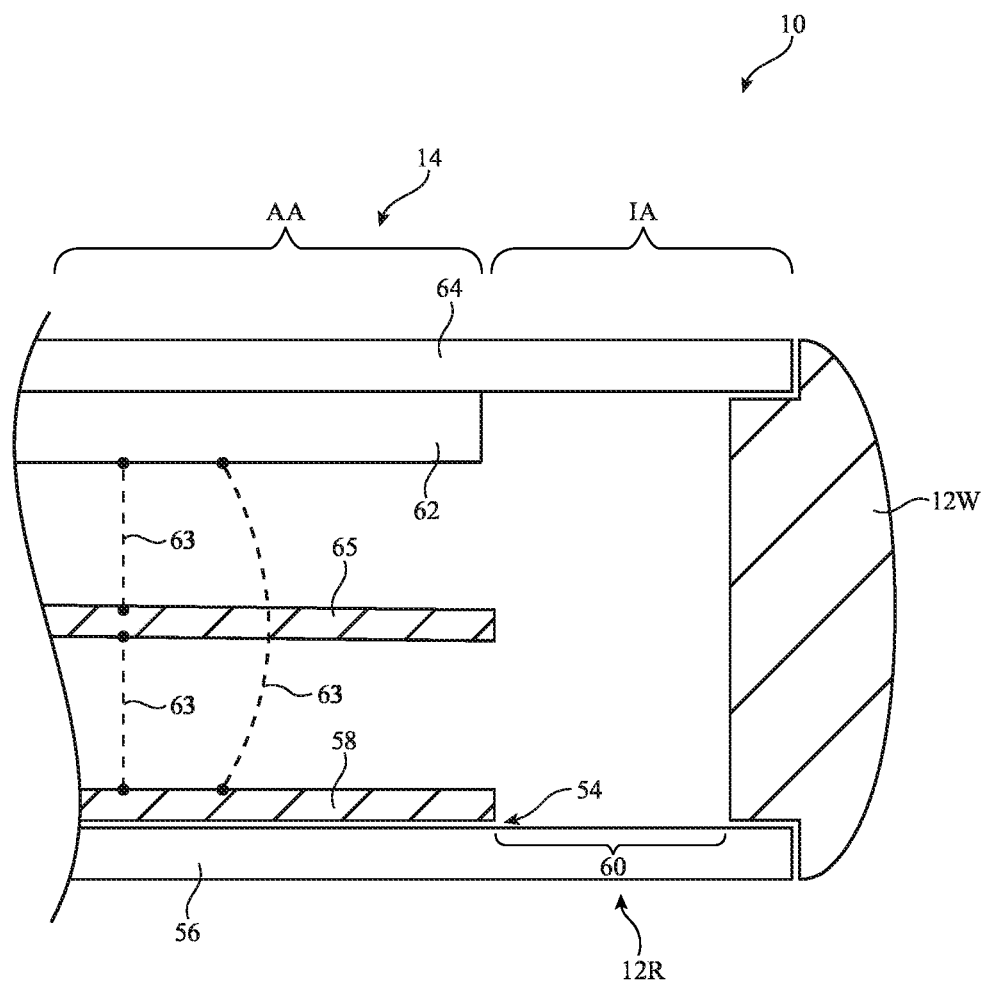
FIG. 4 is a cross-sectional side view of an electronic device having housing structures that may be used in forming antenna structures in accordance with some embodiments.

If desired, conductive electronic device structures such as conductive portions of housing 12 (FIG. 1) may be used to form at least part of one or more of the antennas 40 in device 10. FIG. 4 is a cross-sectional side view of device 10, showing illustrative conductive electronic device structures that may be used in forming one or more of the antennas 40 in device 10.

As shown in FIG. 4, peripheral conductive housing structures 12W may extend around the lateral periphery of device 10 (e.g., as measured in the X-Y plane of FIG. 1). Peripheral conductive housing structures 12W may extend from rear housing wall 12R (e.g., at the rear face of device 10) to display 14 (e.g., at the front face of device 10). In other words, peripheral conductive housing structures 12W may form conductive sidewalls for device 10, a first of which is shown in the cross-sectional side view of FIG. 4 (e.g., a given sidewall that runs along an edge of device 10 and that extends across the width or length of device 10).

Display 14 may have a display module such as display module 62 (sometimes referred to as a display panel). Display module 62 may include pixel circuitry, touch sensor circuitry, force sensor circuitry, and/or any other desired circuitry for forming active area AA of display 14. Display 14 may include a dielectric cover layer such as display cover layer 64 that overlaps display module 62. Display cover layer 64 may include plastic, glass, sapphire, ceramic, and/or any other desired dielectric materials. Display module 62 may emit image light and may receive sensor input (e.g., touch and/or force sensor input) through display cover layer 64. Display cover layer 64 and display 14 may be mounted to peripheral conductive housing structures 12W. The lateral area of display 14 that does not overlap display module 62 may form inactive area IA of display 14.

As shown in FIG. 4, rear housing wall 12R may be mounted to peripheral conductive housing structures 12W (e.g., opposite display 14). Rear housing wall 12R may include a dielectric cover layer such as dielectric cover layer 56. Dielectric cover layer 56 may include glass, plastic, sapphire, ceramic, one or more dielectric coatings, or other dielectric materials. If desired, conductive material may be layered onto some of the interior lateral surface of dielectric cover layer 56. Dielectric cover layer 56 may extend across an entirety of the width of device 10 and/or an entirety of the length of device 10. If desired, dielectric cover layer 56 may be provided with pigmentation and/or an opaque masking layer (e.g., an ink layer) that helps to hide the interior of device 10 from view.

The housing for device 10 may also include one or more conductive support plates interposed between display 14 and rear housing wall 12R. For example, the housing for device 10 may include a first conductive support plate such as conductive support plate 58 and/or may include a second support plate such as conductive support plate 65. Conductive support plate 58 is vertically interposed between dielectric cover layer 56 and display module 62. Conductive support plate 65 is vertically interposed between conductive support plate 58 and display module 62. Conductive support plate 58 is sometimes also referred to herein as conductive lower chassis 58, lower chassis 58, conductive lower plate 58, lower plate 58, lower interior conductive housing wall 58, conductive layer 58, lower conductive layer 58, or lower conductive support plate 58. Conductive support plate 65 is sometimes also referred to herein as conductive mid-chassis 65, mid-chassis 65, conductive mid-plate 65, mid-plate 65, upper interior conductive housing wall 65, conductive layer 65, upper conductive layer 65, or upper conductive support plate 65.

If desired, one of conductive lower chassis 58 or mid-chassis 65 may be omitted. Lower chassis 58 may be layered onto dielectric cover layer 56 without adhesive that adheres lower chassis 58 to dielectric cover layer 56 or may be separated from dielectric cover layer 56 by a non-zero distance (e.g., an air gap). This may, for example, allow dielectric cover layer 56 and/or rear housing wall 58 to be easily removed from device 10 (e.g., to repair and/or replace components within the interior of device 10). Alternatively, lower chassis 58 may be adhered to dielectric cover layer 56 (e.g., may form a part of rear housing wall 12R). Mid-chassis 65 may be located at a first distance from display 14 whereas lower chassis 58 is located at a second distance that is greater than the first distance from display 14.

Mid-chassis 65 and/or lower chassis 58 may extend across an entirety of the width of device 10 (e.g., between the left and right edges of device 10 as shown in FIG. 1). Mid-chassis 65 and/or lower chassis 58 may be formed from an integral portion of peripheral conductive housing structures 12W that extends across the width of device 10 or may include a separate housing structures attached, coupled, or affixed (e.g., welded) to peripheral conductive housing structures 12W. One or more components may be supported by mid-chassis 65 and/or lower chassis 58 (e.g., logic boards such as a main logic board, a battery, etc.). Mid-chassis 65 and/or lower chassis 58 may contribute to the mechanical strength of device 10 (e.g., to prevent external twisting or bending forces from damaging device 10). Mid-chassis 65 and/or lower chassis 58 may be formed from metal (e.g., stainless steel, aluminum, titanium, etc.).

Lower chassis 58, mid-chassis 65, and/or display module 62 may have an edge 54 that is separated from peripheral conductive housing structures 12W by dielectric-filled slot 60 (sometimes referred to herein as opening 60, gap 60, or aperture 60). Slot 60 may be filled with air, plastic, ceramic, or other dielectric materials. Conductive housing structures such as lower chassis plate 58, mid-chassis 65, conductive portions of display module 62, and/or peripheral conductive housing structures 12W (e.g., the portion of peripheral conductive housing structures 12W opposite lower chassis plate 58, mid-chassis 65, and display module 62 at slot 60) may be used to form antenna structures for one or more of the antennas 40 in device 10.

For example, peripheral conductive housing structures 12W may form an antenna resonating element arm (e.g., an inverted-F antenna resonating element arm) in the antenna resonating element 45 (FIG. 3) of an antenna 40 in device 10. Mid-chassis 65, lower chassis 58, and/or display module 62 may be used to form the antenna ground 49 (FIG. 3) for one or more of the antennas 40 in device 10 and/or to form one or more edges of slot antenna resonating elements for the antennas in device 10. One or more conductive interconnect structures 63 may electrically couple mid-chassis 65 to lower chassis 58, one or more conductive interconnect structures 63 may electrically couple mid-chassis 65 to conductive structures in display module 62 (sometimes referred to herein as conductive display structures), and/or one or more conductive interconnect structures 63 may electrically couple conductive structures in display module 62 to lower chassis 58 so that each of these elements form part of the antenna ground. The conductive structures in display module 62 may include a conductive frame, bracket, or support plate for display module 62, shielding layers in display module 62, ground traces in display module 62, etc.

Conductive interconnect structures 63 may serve to ground mid-chassis 65 to lower chassis 58 and/or display module 62 (e.g., to ground lower chassis 58 to the conductive display structures through mid-chassis 65) or may ground display module 62 directly to lower chassis 58. Put differently, conductive interconnect structures 63 may hold the conductive structures in display module 62, mid-chassis 65, and/or lower chassis 58 to a common ground or reference potential (e.g., as a system ground for device 10 that is used to form part of antenna ground 49 of FIG. 3). Conductive interconnect structures 63 may therefore sometimes be referred to herein as grounding structures 63, grounding interconnect structures 63, or vertical grounding structures 63. Conductive interconnect structures 63 may include conductive traces, conductive pins, conductive springs, conductive prongs, conductive brackets, conductive screws, conductive clips, conductive tape, conductive wires, conductive traces, conductive foam, conductive adhesive, solder, welds, metal members (e.g., sheet metal members), contact pads, conductive vias, conductive portions of one or more components mounted to mid-chassis 65 and/or lower chassis 58, and/or any other desired conductive interconnect structures.

Figure 5:
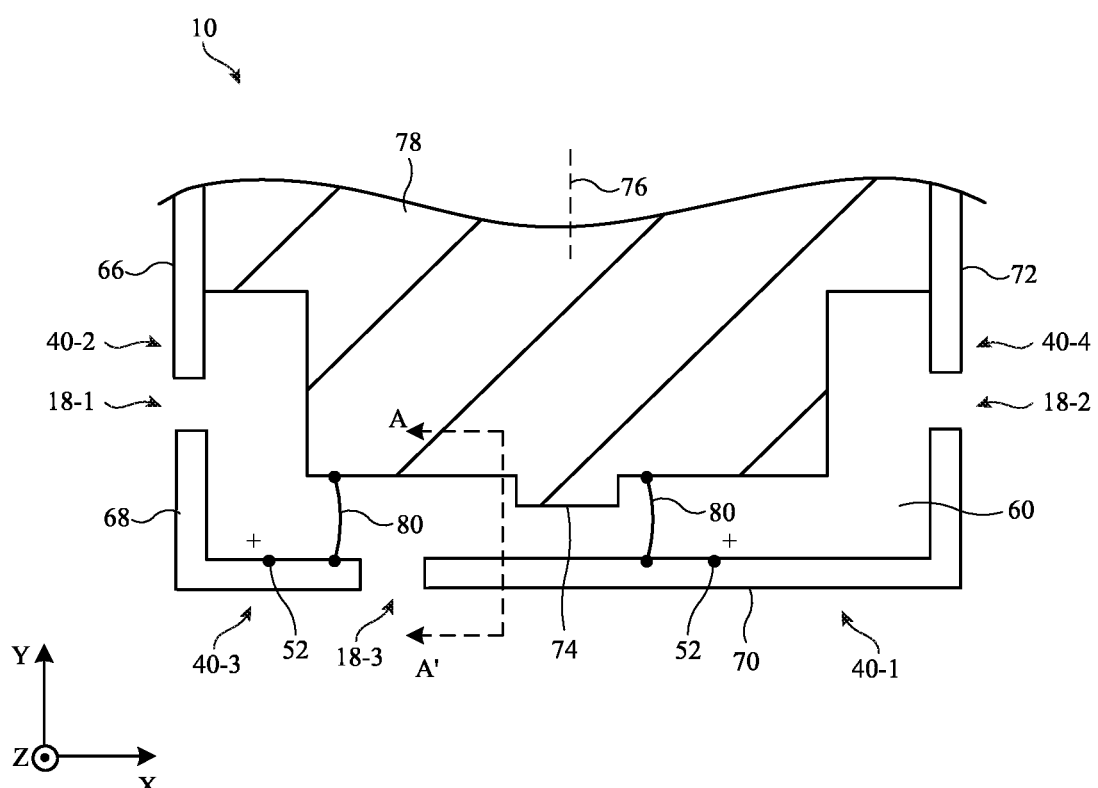
FIG. 5 is a top interior view of the lower end of an illustrative electronic device having peripheral conductive housing structures with a dielectric gap for separating the resonating elements of two antennas in accordance with some embodiments.

If desired, device 10 may include multiple slots 60 and peripheral conductive housing structures 12W may include multiple dielectric gaps that divide the peripheral conductive housing structures into segments (e.g., dielectric gaps 18 of FIG. 1). FIG. 5 is a top interior view showing how the lower end of device 10 (e.g., within region 22 of FIG. 1) may include a slot 60 and may include multiple dielectric gaps that divide the peripheral conductive housing structures into segments for forming multiple antennas. Display 14 and other internal components have been removed from the view shown in FIG. 5 for the sake of clarity.

As shown in FIG. 5, peripheral conductive housing structures 12W may include a first conductive sidewall at the left edge of device 10, a second conductive sidewall at the top edge of device 10 (not shown in FIG. 5), a third conductive sidewall at the right edge of device 10, and a fourth conductive sidewall at the bottom edge of device 10 (e.g., in an example where device 10 has a substantially rectangular lateral shape). Peripheral conductive housing structures 12W may be segmented by dielectric-filled gaps 18 such as a first gap 18-1, a second gap 18-2, and a third gap 18-3. Gaps 18-1, 18-2, and 18-3 may be filled with plastic, ceramic, sapphire, glass, epoxy, or other dielectric materials. The dielectric material in the gaps may lie flush with peripheral conductive housing structures 12W at the exterior surface of device 10 if desired.

Gap 18-1 may divide the first conductive sidewall to separate segment 66 of peripheral conductive housing structures 12W from segment 68 of peripheral conductive housing structures 12W. Gap 18-2 may divide the third conductive sidewall to separate segment 72 from segment 70 of peripheral conductive housing structures 12W. Gap 18-3 may divide the fourth conductive sidewall to separate segment 68 from segment 70 of peripheral conductive housing structures 12W. In this example, segment 68 forms the bottom-left corner of device 10 (e.g., segment 68 may have a bend at the corner) and is formed from the first and fourth conductive sidewalls of peripheral conductive housing structures 12W (e.g., in lower region 22 of FIG. 1). Segment 70 forms the bottom-right corner of device 10 (e.g., segment 70 may have a bend at the corner) and is formed from the third and fourth conductive sidewalls of peripheral conductive housing structures 12W (e.g., in lower region 22 of FIG. 1).

Device 10 may include ground structures 78 (e.g., structures that form part of the antenna ground 49 of FIG. 3 for one or more of the antennas 40 in device 10). Ground structures 78 may include one or more metal layers such as conductive structures in display module 62 (FIG. 4), mid-chassis 65 (FIG. 4), lower chassis 58 (FIG. 4), conductive traces on a printed circuit board, conductive portions of one or more components in device 10, conductive interconnect structures that couple two or more of these structures together (e.g., conductive pins, conductive adhesive, welds, conductive tape, conductive foam, conductive springs, conductive interconnect structures 63 of FIG. 4, etc.), and/or other grounded conductors in device 10.

Ground structures 78 (e.g., mid-chassis 65 and/or lower chassis 58 of FIG. 4) may extend between opposing sidewalls of peripheral conductive housing structures 12W. For example, ground structures 78 may extend from segment 66 to segment 72 of peripheral conductive housing structures 12W (e.g., across the width of device 10, parallel to the X-axis of FIG. 5). Ground structures 78 may be welded or otherwise affixed to segments 66 and 72. In another suitable arrangement, some or all of ground structures 78, segment 66, and segment 72 may be formed from a single, integral (continuous) piece of machined metal (e.g., in a unibody configuration). Ground structures 78 may include a ground extension 74 that protrudes into slot 60 and that may, if desired, bridge slot 60 and couple the ground structures to the peripheral conductive housing structures. Ground extension 74 may be formed from a data connector for device 10, as one example. Device 10 may have a longitudinal axis 76 that bisects the width of device 10 and that runs parallel to the length of device 10 (e.g., parallel to the Y-axis).

As shown in FIG. 5, slot 60 may separate ground structures 78 from segments 68 and 70 of peripheral conductive housing structures 12W (e.g., the upper edge of slot 60 may be defined by ground structures 78 whereas the lower edge of slot 60 is defined by segments 68 and 70). Slot 60 may have an elongated shape extending from a first end at gap 18-1 to an opposing second end at gap 18-2 (e.g., slot 60 may span the width of device 10). Slot 60 may be filled with air, plastic, glass, sapphire, epoxy, ceramic, or other dielectric material. Slot 60 may be continuous with gaps 18-1, 18-2, and 18-3 in peripheral conductive housing structures 12W if desired (e.g., a single piece of dielectric material may be used to fill both slot 60 and gaps 18-1, 18-2, and 18-3).

Ground structures 78, segment 66, segment 68, segment 70, and portions of slot 60 may be used in forming multiple antennas 40 in the lower region of device 10 (sometimes referred to herein as lower antennas). For example, device 10 may include an antenna 40-3 (sometimes referred to herein as ANT3) having an antenna resonating (radiating) element formed from segment 68 and having an antenna ground formed from ground structures 78. Antenna 40-3 may have at least one positive antenna feed terminal 52 coupled to segment 68. If desired, antenna 40-3 may have one or more ground paths 80 (e.g., short pins, short paths, or return paths) coupled between one or more locations on segment 68 and one or more locations on ground structures 78. If desired, conductive interconnect structures 63 (FIG. 4) may form some or all of one or more of the ground paths 80 in antenna 40-3. If desired, tuner circuitry (e.g., an aperture tuner), impedance matching circuitry, switching circuitry, filter circuitry, inductors (e.g., switchable inductors), capacitors (e.g., switchable capacitors), and/or other circuit components may be disposed on one or more of the ground paths 80 in antenna 40-3.

Device 10 may include also include an antenna 40-1 (sometimes referred to herein as ANT1) having an antenna resonating (radiating) element formed from segment 70 and having an antenna ground formed from ground structures 78. Antenna 40-1 may have at least one positive antenna feed terminal 52 coupled to segment 68. If desired, antenna 40-1 may have one or more ground paths 80 (e.g., short pins, short paths, or return paths) coupled between one or more locations on segment 70 and one or more locations on ground structures 78. If desired, conductive interconnect structures 63 (FIG. 4) may form some or all of one or more of the ground paths 80 in antenna 40-1. If desired, tuner circuitry (e.g., an aperture tuner), impedance matching circuitry, switching circuitry, filter circuitry, inductors (e.g., switchable inductors), capacitors (e.g., switchable capacitors), and/or other circuit components may be disposed on one or more of the ground paths 80 in antenna 40-1.

If desired, device 10 may include an antenna 40-2 having a slot antenna resonating element formed from a portion of slot 60 between segment 66 and ground structures 78. If desired, device 10 may include an antenna 40-4 having a slot antenna resonating element formed from a portion of slot 60 between segment 72 and ground structures 78. Antennas 40-1 and 40-3 may be, for example, inverted-F antennas each having at least one return path (e.g., ground path 80) that couples the respective resonating element arms to the antenna ground. Antennas 40-1, 40-2, 40-3, and 40-4 may convey radio-frequency signals in one or more frequency bands. For example, antennas 40-1 and 40-3 may convey radio-frequency signals in at least the cellular low band (LB), the cellular midband (MB), and/or the cellular high band (HB). This may allow antennas 40-1 and 40-3 to perform MIMO communications in one or more of these bands, thereby maximizing data throughput.

It may be desirable for display module 62 (FIG. 4) and thus the active area AA of display 14 to be as large as possible to maximize display viewing area for the user of device 10. However, if care is not taken, increasing the lateral area of display module 62 and active area AA can undesirably limit the radio-frequency performance of antennas 40-1, 40-2, 40-3, and/or 40-4 at the lower end of device 5.

Figure 6:
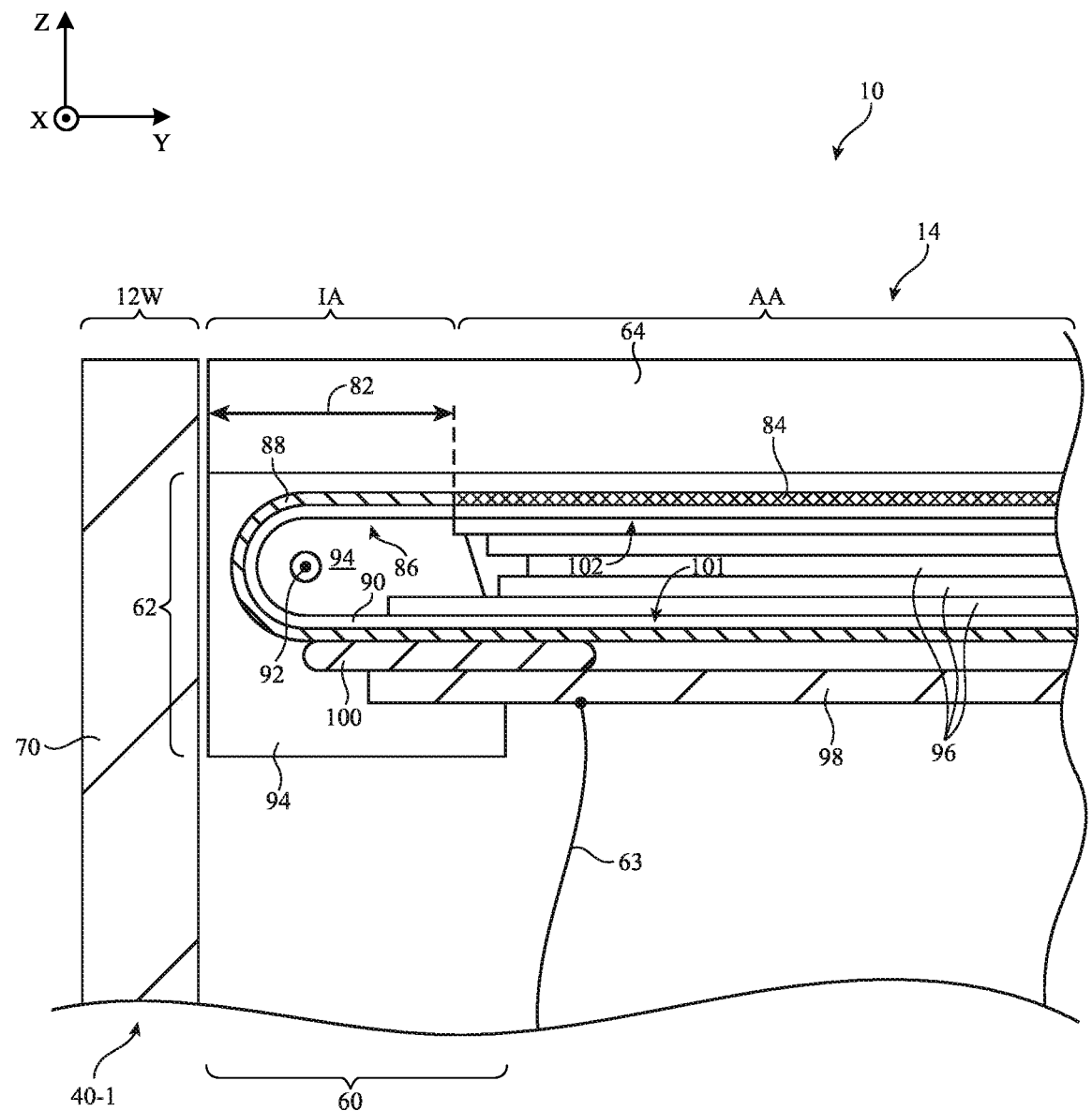
FIG. 6 is a cross-sectional side view of an illustrative electronic device having a display module overlapping an antenna formed from a segment of peripheral conductive housing structures in accordance with some embodiments.

FIG. 6 is a cross-sectional side view (e.g., as taken along line AA' of FIG. 5) showing how display module 62 may coexist with antenna 40-1 at the lower end of device 10. As shown in FIG. 6, display 14 may be mounted to segment 70 of peripheral conductive housing structures 12W (e.g., the antenna resonating element for antenna 40-1). Display 14 may include display cover layer 64 overlapping display module 62.

Display module 62 may include a flexible printed circuit such as flexible printed circuit 86 (sometimes referred to herein as display flex 86). Flexible printed circuit 62 may have a first portion 102 and a second portion 101 extending away from first portion 102. Portion 101 may be coupled to display driver circuitry (not shown) in device 10 (e.g., on a logic board within device 10). Portion 102 may include pixel circuitry 84. Pixel circuitry 84 may emit light (e.g., images) through display cover layer 64. The lateral area spanned by pixel circuitry 84 forms active area AA for display 14.

Portion 102 of flexible printed circuit 86 is folded with respect to portion 101 about or around axis 92 (e.g., an axis extending parallel to the X-axis). Flexible printed circuit 86 may be folded around axis 92 by approximately 180 degrees (e.g., 140-220 degrees, 180 degrees, 170-200 degrees, etc.). Display module 62 may include one or more display layers such as layers 96 vertically interposed between portions 102 and 101 of flexible printed circuit 86. Layers 96 may include support structures, carriers, display circuitry, active circuitry, passive circuitry, brackets, spacers, interposers, one or more printed circuit boards, electromagnetic shielding components, display components, touch sensor components, force sensor components, one or more layers of adhesive (e.g., pressure-sensitive adhesive), one or more encapsulation layers, and/or any other desired components within display module 62.

Flexible printed circuit 86 may include conductive traces 88 on one or more layers of flexible printed circuit substrate 90 (e.g., one or more polyimide layers). Conductive traces 88 may extend from portion 101 of flexible printed circuit 86, around the bend in flexible printed circuit 86 (e.g., around axis 92), and to pixel circuitry 84 (e.g., some of conductive traces 88 may be coupled to pixel circuitry 84). Conductive traces 88 may include ground traces (e.g., traces held at a ground potential) and/or signal (drive) traces that convey image data (e.g., pixel data) to pixel circuitry 84 from the display driver circuitry (not shown) coupled to portion 101 of flexible printed circuit 86.

Display module 62 may include a conductive frame or support plate such as display frame 98. Display frame 98 is sometimes also referred to herein as display support plate 98, conductive support plate 98, conductive display bracket 98, or display bracket 98. Display frame 98 may be formed from sheet metal (e.g., aluminum, stainless steel, etc.) that extends under portions 101 and 102 of flexible printed circuit 86 (e.g., flexible printed circuit 86 is vertically interposed between display frame 98 and display cover layer 64). If desired, display frame 98 may include one or more bent or folded portions (not shown) such as conductive prongs, tabs, or extensions.

In some implementations, the edge of display frame 98 includes a bent extension, lip, or prong that extends away from flexible printed circuit 86 and towards segment 70 of peripheral conductive housing structures 12W (e.g., that extends vertically upwards such that the bent extension is laterally interposed between at least some of flexible printed circuit 86 and segment 70). The bent extension may help to hold the components of display module 62 in place and may help to block electromagnetic interference between display module 62 and antenna 40-1. However, such an extension can cause inactive area IA to be excessively wide, thereby limiting the size of active area AA. By omitting bent extensions at the edge of display frame 98 and facing (extending towards) peripheral conductive housing structures 12W, the width 82 of inactive area IA may be reduced and the width of active area AA may be increased by 200-500 microns or greater.

To help hold the components of display module 62 in place and to help protect the components of display module 62 from damage, contaminants, and/or moisture without the use of a bent extension at the edge of display frame 98, display module 62 may include a plastic overmold 94 disposed at or around the periphery of display module 62. Plastic overmold 94 may be, for example, a low injection pressure overmolding (LIPO) structure (sometimes also referred to herein simply as a low injection pressure overmold or a low injection pressure overmolding). Plastic overmold 94 may encapsulate the end/edge of display module 62, display frame 98, at least some of portions 102 and 101 of flexible printed circuit 86, and/or the portion of flexible printed circuit 86 that is folded or bent around axis 92. Put differently, the end/edge of display module 62, display frame 98, at least some of portions 102 and 101 of flexible printed circuit 86, and/or the portion of flexible printed circuit 86 that is folded or bent around axis 92 may be embedded within plastic overmold 94.

Plastic overmold 94 may help to hold the fold/bend in flexible printed circuit 86 in place (about axis 92), may help to hold the components of display module 62 in place, may help to attach or secure display module 62 to display cover layer 64, may form a protective bumper between display module 62 and peripheral conductive housing structures 12W, and/or may help to protect the components of display module 62 from damage, contaminants, and/or moisture. At the same time, plastic overmold 94 may allow display module 62 to be disposed as close to segment 70 as possible (e.g., relative to implementations when display frame 98 includes a bent extension that rises between flexible printed circuit 86 and segment 70), thereby minimizing the width 82 of inactive area IA and maximizing the size of active area AA.

Given the close proximity of the active circuitry in display module 62 (e.g., pixel circuitry 84, conductive traces 88, etc.) to the antenna resonating element of antenna 40-1 (e.g., segment 70), if care is not taken, the operation of display 14 can produce undesirable signal interference at antenna 40-1 and/or the operation of antenna 40-1 can produce undesirable signal interference at display 14. Further, if the conductive components in display module 62 are not held at a ground potential (e.g., forming part of the antenna ground for antenna 40-1), the conductive components can deteriorate the wireless performance (e.g., efficiency bandwidth) of antenna 40-1.

To mitigate these issues, display frame 98 may be coupled to underlying ground structures (e.g., mid-chassis 65 and/or lower chassis 58 of FIG. 4) via conductive interconnect structure 63. In addition, display module 62 may include a conductive interconnect structure 100 that electrically couples (e.g., grounds or shorts) the conductive traces 88 on flexible printed circuit 86 (e.g., ground traces on flexible printed circuit 86) to display frame 98. Conductive interconnect structures 63 may serve to ground the conductive traces 88 on flexible printed circuit 86 to the underlying ground structures (e.g., mid-chassis 65 and/or lower chassis 58 of FIG. 4) via display frame 98. In this way, the conductive traces 88 on flexible printed circuit 86 (e.g., the ground traces on flexible printed circuit 86), display frame 98, and/or other conductive structures in display module 62 may be held at a ground potential to form part of the antenna ground 49 (FIG. 3) for antenna 40-1 (e.g., together with the underlying ground structure such as lower chassis 58 and/or mid-chassis 65 of FIG. 4). This may serve to maximize the wireless performance (e.g., efficiency bandwidth) of antenna 40-1. Conductive interconnect structure 63 may form part of a corresponding ground path 80 (FIG. 5) for antenna 40-1, for example.

Conductive interconnect structure 100 may be formed from conductive adhesive and/or conductive foam (e.g., a layer of conductive foam having adhesive surfaces that are adhered to display frame 98 and conductive traces 88, a conductive gasket such as an air loop gasket (ALG) that is adhered to conductive traces 88 and display frame 98, etc.). Conductive interconnect structure 100 may be at least partially embedded within plastic overmold 94 (e.g., plastic overmold 94 may be molded over at least some of conductive interconnect structure 100). Conductive interconnect structure 100 may be coupled to flexible printed circuit 86 at or adjacent to the bend in flexible printed circuit 86 (e.g., at least some of conductive interconnect structure 100 may overlap axis 92). The conductive foam may exert a biasing force (e.g., spring force) against display frame 98 and conductive traces 88 that helps to ensure a robust mechanical and thus electrical connection between conductive traces 88 and display frame 98 during the operating life of device 10. Conductive interconnect structure 100 serves to ground or short conductive traces 88 to display frame 98. In this way, conductive interconnect structure 100 may block electromagnetic energy produced by antenna 40-1 while conveying radio-frequency signals from passing into display module 62 and interfering with the operation of display 14. At the same time, conductive interconnect structure 100 may block electromagnetic energy produced by display 14 while displaying images from passing onto segment 70 and interfering with the operation of antenna 40-1.

Figure 7:
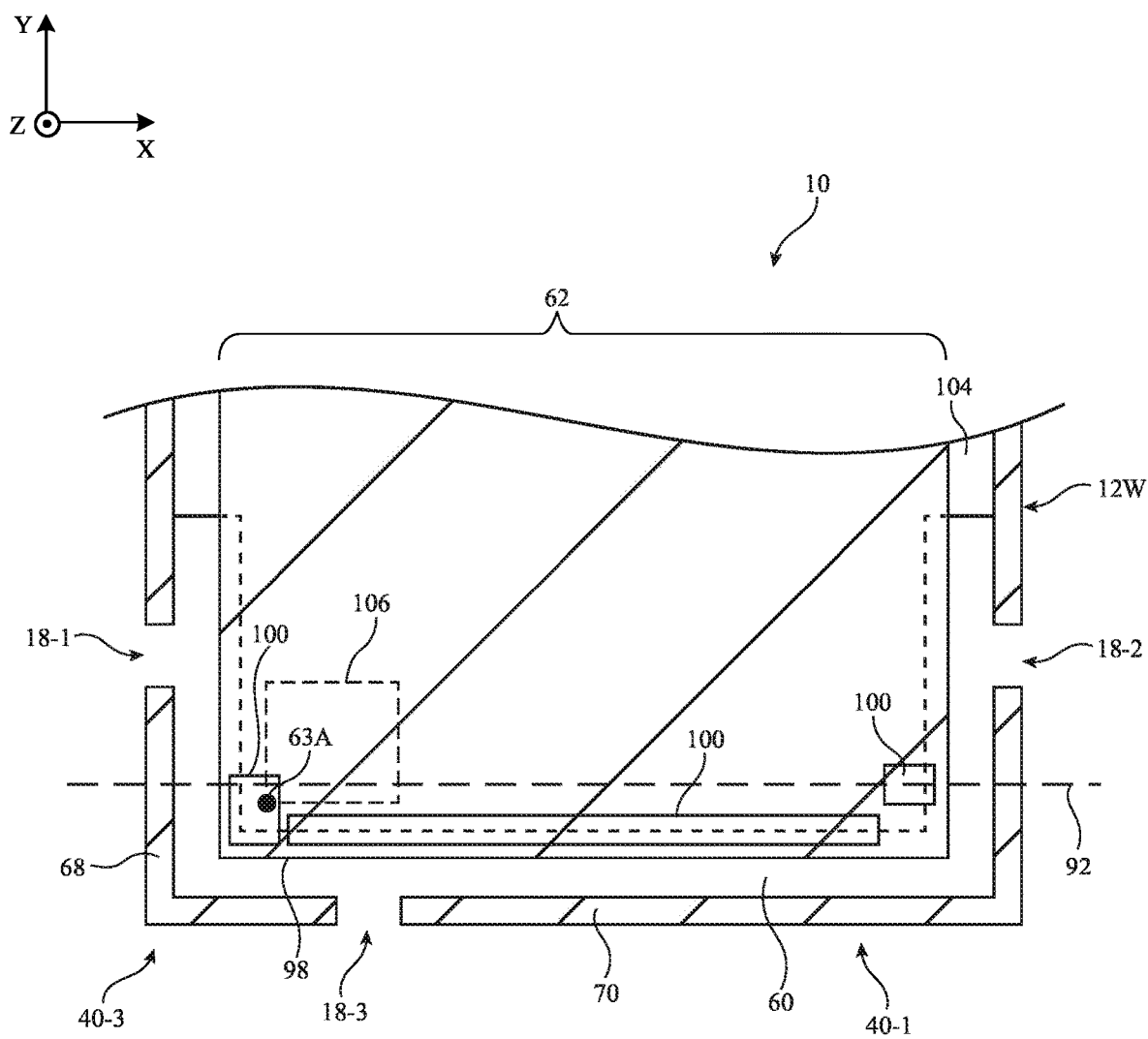
FIG. 7 is a top interior view of the lower end of an illustrative electronic device showing how a display module may overlap an underlying ground structure in accordance with some embodiments.

FIG. 7 is an interior top view of the lower end of device 10 showing how display module 62 may overlap underlying ground structures. In the example of FIG. 7, display cover layer 64 and other internal device components have been omitted for the sake of clarity.

As shown in FIG. 7, display module 62 may extend across substantially all of the length and width of device 10. Display module 62 may overlap an underlying ground structure 104. Ground structure 104 may form part of ground structures 78 of FIG. 5. Ground structure 104 may include mid-chassis 65 and/or lower chassis 58 of FIG. 4. Ground structure 104 may extend from the left side to the right side of device 10 (e.g., between opposing walls of peripheral conductive housing structure 12W). Ground structure 104 may be laterally separated from segments 68 and 70 of peripheral conductive housing structures 12W by slot 60.

The flexible printed circuit 86 (FIG. 6) in display module 62 may be folded over itself around axis 92 at the lower end of device 10 (e.g., where axis 92 overlaps the lower edge of ground structure 104 and/or slot 60 and extends parallel to the width of device 10 and the X-axis). In this way, portions 101 and 102 of flexible printed circuit 86 (FIG. 6) extend away from the fold in the flexible printed circuit (e.g., longitudinal axis 92) and towards (facing) the upper end of device 10.

One or more conductive interconnect structures 100 may couple flexible printed circuit 86 to display frame 98 (FIG. 6) in display module 62 at one or more corresponding locations along the lateral area of display module 62. In the example of FIG. 7, display module 62 includes three conductive interconnect structures 100 (e.g., three pieces of conductive foam) that couple flexible printed circuit 86 to display frame 98 (FIG. 6) at different locations along the lower end of device 10 (e.g., to help electromagnetically isolate both segments 68 and 70 from display module 62). The pieces of conductive foam may have an elongated shape (e.g., extending across most of the width of device 10) and/or may have other shapes (e.g., confined to a small portion or region of the lateral area of display module 62). In general, display module 62 may include any desired number of conductive interconnect structures 100 (e.g., pieces of conductive foam) disposed at any desired locations and having any desired shapes.

As shown in FIG. 7, a conductive interconnect structure 63 such as conductive interconnect structure 63A may couple display panel 62 to ground structure 104 at or adjacent antenna 40-3. Conductive interconnect structure 63A may form part of a ground path 80 (FIG. 5) for antenna 40-3. While antenna 40-1 and/or antenna 40-3 may include one or more additional conductive interconnect structures 63 coupled between ground structure 104 and display module 62, these conductive interconnect structures have been omitted from FIG. 7 for the sake of clarity.

Conductive interconnect structure 63A may help to ensure that the conductive structures of display module 62 are held at the same ground potential as ground structure 104 at locations close to the antenna resonating element for antenna 40-3 (e.g., to form part of the antenna ground 49 of FIG. 3 for antenna 40-3, thereby optimizing the wireless performance of antenna 40-3). If desired, conductive interconnect structure 63A may also serve to ground an underlying conductive component 106 to ground structure 104. Conductive component 106 may include, for example, the frame, housing, and/or other conductive structures in a vibrator or haptic engine in device 10, a ringer in device 10, a speaker in device 10, a ventilation structure in device 10, a microphone structure in device 10, a data connector in device 10, etc. This is merely illustrative and, in general, conductive component 106 may include any desired conductive structure in device 10.

Figure 8:
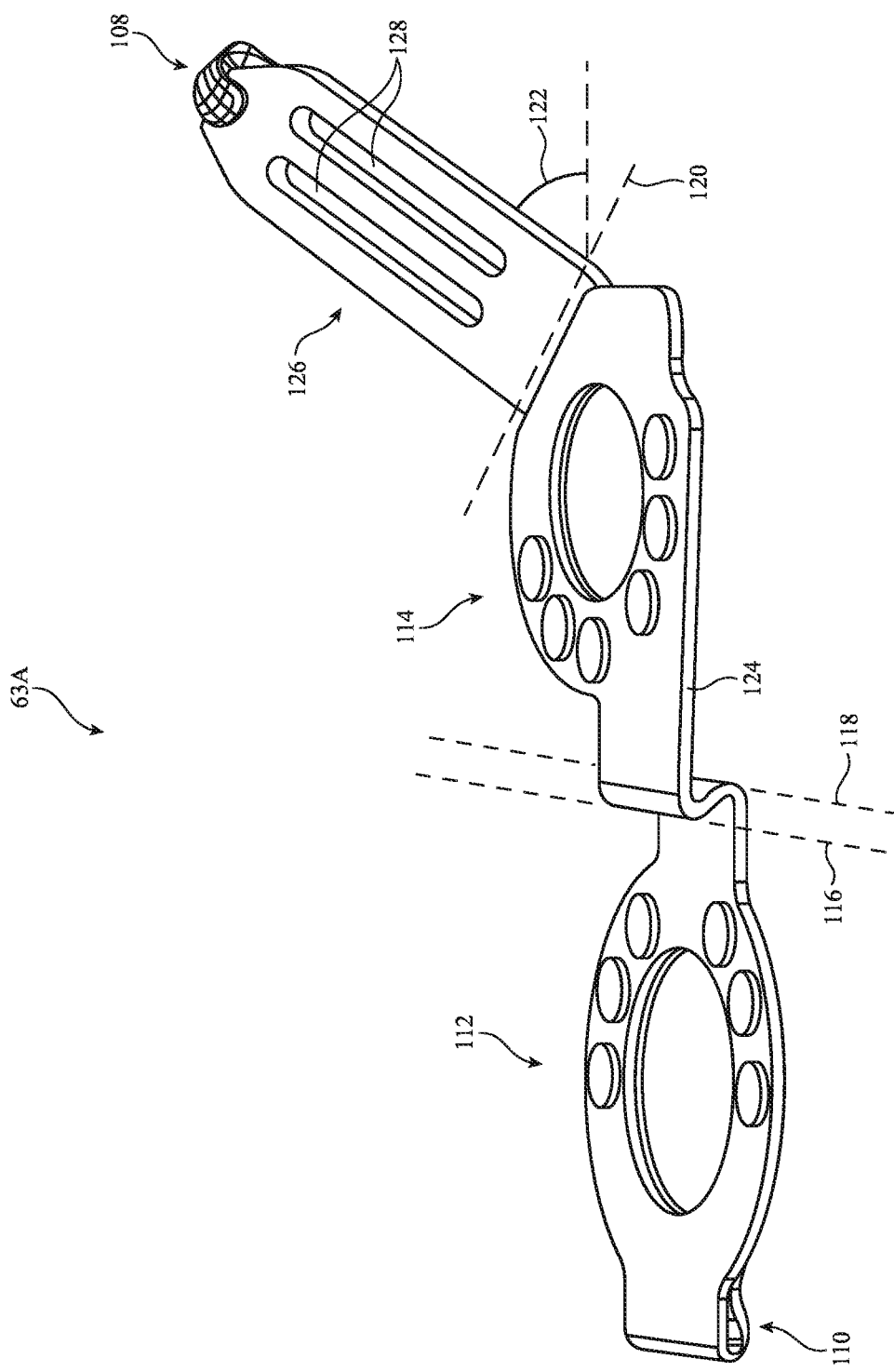
FIG. 8 is a perspective view of an illustrative conductive spring that may be used to couple a display module to underlying ground structures in accordance with some embodiments.

In some implementations, conductive interconnect structure 63A includes a conductive spring. FIG. 8 is a perspective view of conductive interconnect structure 63A in implementations where conductive interconnect structure 63A is a conductive spring. Conductive interconnect structure 63A is therefore sometimes also referred to herein as conductive spring 63A.

As shown in FIG. 8, conductive spring 63A may be formed from a piece of sheet metal 124 that has been folded or bent around one or more axes. Conductive spring 63A may have a first end 110 that is coupled to, welded to, soldered to, and/or pressed against ground structure 104 of FIG. 7 (e.g., mid-chassis 65 or lower chassis 58 of FIG. 4). Conductive spring 63A may have an opposing second end 108 that is coupled to, welded to, soldered to, and/or pressed against display frame 98 of display module 62 (FIG. 6). In this way, conductive spring 63A forms a ground path (e.g., ground path 80 in antenna 40-3) from display frame 98 to ground structure 104 (FIG. 7).

Sheet metal 124 may have a first portion 112 at end 110, a second portion 126 at end 108, and a third portion 114 that is interposed or coupled between first portion 112 and second portion 126. Portion 112 may include a first opening or hole (e.g., for receiving a conductive screw or other interconnect structure that secures conductive spring 63A to the underlying ground structure 104 and/or other conductive structures in device 10). Portion 114 may include a second opening or hole (e.g., for receiving a conductive screw or other interconnect structure that secures conductive spring 63A to an underlying conductive structure in device 10 such as conductive component 106 of FIG. 7).

Portion 112 of sheet metal 124 may be folded or bent about one or more axes such as at least a first axis 116 and a second axis 118 relative to portion 114 of sheet metal 124. Sheet metal 124 may be folded in a first direction about axis 116 by an angle of around 45-200 degrees. Sheet metal 124 may be folded in a second direction (e.g., opposite the first direction) about axis 118 by an angle of around 45-200 degrees. Axis 116 may extend parallel to axis 118 or may be non-parallel with respect to axis 118. Axis 118 may be non-parallel (e.g., rotated or twisted) with respect to axis 118 and/or axis 116.

Portion 126 of sheet metal 124 may be folded or bent about an axis such as axis 120 relative to portion 114 of sheet metal 124. Portion 126 may be folded or bent by an angle 122 relative to the plane of portion 114. Angle 122 may be 45 degrees, 30-60 degrees, or another angle between 0 degrees and 90 degrees. The folds/bends in conducive spring 63A and the rigidity of sheet metal 124 may configure conductive spring 63A to exert a biasing force (e.g., a spring force) upwards at end 108 and downwards at end 110. If desired, portion 126 may include one or more openings such as notches 128. Notches 128 (sometimes also referred to herein as elongated holes 128 or slots 128) may extend parallel to the longitudinal axis of portion 126 (e.g., from portion 114 to end 108).

Portion 126 may have a relatively large width and/or a relatively narrow thickness to help reduce the inductance of conductive spring 63A (e.g., portion 126 may wider and/or thicker than portion 114 and/or portion 112). Notches 128 may also help to reduce the inductance of conductive spring 63A. Portion 126 may include one notch 128, two notches 128 (e.g., parallel notches), more than two notches 128, or no notches 128. The width of portion 126, the thickness of portion 126, and/or the notch(es) 128 in portion 126 may be selected to collectively reduce the inductance of conductive spring 63A (e.g., to 1.5 nH or less) while allowing conductive spring 63A to exert a similar spring force as when sheet metal 124 has a uniform width, a uniform thickness, and no notches 128, thereby optimizing the antenna efficiency of antenna 40-3. The example of FIG. 8 is merely illustrative and, in general, conductive spring 63A may have other shapes or configurations.

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). As used herein, the term "while" is synonymous with "concurrent."

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is illustrative and various modifications can be made by those skilled in the art without departing from the scope and spirit of the described embodiments. The foregoing embodiments may be implemented individually or in any combination.

What is claimed is:

1. An electronic device comprising:
   peripheral conductive housing structures, wherein a segment of the peripheral conductive housing structures forms an antenna resonating element arm for an antenna; and
   a display mounted to the peripheral conductive housing structures, wherein the display includes
      a conductive frame,
      a flexible printed circuit having a first portion with pixel circuitry and a second portion that is folded with respect to the first portion about an axis,
      conductive foam that couples a conductive trace on the second portion of the flexible printed circuit to the conductive frame, and
      a plastic overmold molded over the flexible printed circuit at the bend, at least some of the conductive frame, and at least some of the conductive foam.

2. The electronic device of claim 1, wherein the plastic overmold comprises a low injection pressure overmolding (LIPO).

3. The electronic device of claim 1, wherein the axis extends parallel to the segment of the peripheral conductive housing structures.

4. The electronic device of claim 3, wherein at least some of the plastic overmold is interposed between the flexible printed circuit and the segment of the peripheral conductive housing structures.

5. The electronic device of claim 1, wherein the conductive trace extends into the first portion of the flexible printed circuit around the axis.

6. The electronic device of claim 1, wherein the display comprises a display cover layer, the pixel circuitry is configured to emit light through the display cover layer, and the first and second portions of the flexible printed circuit extend parallel to the display cover layer.

7. The electronic device of claim 1, further comprising:
   a conductive plate extending from a first wall of the peripheral conductive housing structures to a second wall of the peripheral conductive housing structures opposite the first wall, the conductive plate being separated from the segment of the peripheral conductive housing structures by a slot; and
   a dielectric cover layer mounted to the peripheral conductive housing structures opposite the display.

8. The electronic device of claim 7, wherein the conductive plate is separated from the dielectric cover layer by a non-zero distance.

9. The electronic device of claim 7, further comprising:
   a conductive spring that couples the conductive frame to the conductive plate.

10. The electronic device of claim 9, wherein the conductive spring comprises sheet metal extending from a first end to a second end, the first end is coupled to the conductive plate, the second end is coupled to the conductive frame, and the sheet metal includes at least three bends.

11. The electronic device of claim 10, wherein the sheet metal has a first bend about a first axis, a second bend about a second axis parallel to the first axis, and a third bend about a third axis non-parallel to the second axis, the sheet metal having a first portion extending from the first end to the first bend, a second portion extending from the second bend to the third bend, and a third portion extending from the third bend to the second end.

12. The electronic device of claim 11, wherein the third portion is wider than the second portion.

13. The electronic device of claim 11, wherein the third portion is thinner than the second portion.

14. The electronic device of claim 11, wherein the third portion comprises at least one notch.

15. An electronic device comprising:
   peripheral conductive housing structures, wherein a segment of the peripheral conductive housing structures forms a radiating arm for an antenna; and
   a display mounted to the peripheral conductive housing structures, wherein the display includes
      a conductive frame,
      a flexible printed circuit mounted to the conductive frame, wherein the flexible printed circuit has a bend about an axis and the bend faces the segment of the peripheral conductive housing structures,
      conductive foam that couples the flexible printed circuit to the conductive frame, the conductive foam overlapping the axis, and
      a low injection pressure overmolding (LIPO), wherein the bend of the flexible printed circuit, at least some of the conductive frame, and at least some of the conductive foam are embedded within the LIPO.

16. The electronic device of claim 15, wherein the conductive foam shorts a conductive trace on the flexible printed circuit to the conductive frame.

17. The electronic device of claim 16, wherein the antenna comprises an antenna ground that includes the conductive trace, the conductive frame, and the conductive foam.

18. The electronic device of claim 17, further comprising:
   a conductive plate extending from a first wall of the peripheral conductive housing structures to a second wall of the peripheral conductive housing structures opposite the first wall, the conductive plate being separated from the segment of the peripheral conductive housing structures by a slot, and the conductive plate forming part of the antenna ground; and
   a conductive spring that shorts the conductive frame to the conductive plate.

19. An electronic device comprising:
   a housing having peripheral conductive housing structures, a dielectric cover layer mounted to the peripheral conductive housing structures, and a conductive plate that extends from a first wall of the peripheral conductive housing structures to a second wall of the peripheral conductive housing structures;
   an antenna having a radiating arm formed from a segment of the peripheral conductive housing structures and having an antenna ground that includes the conductive plate, the conductive plate being separated from the segment by a slot;

a display mounted to the peripheral conductive housing structures opposite the dielectric cover layer, the conductive plate being interposed between the dielectric cover layer and the display, and the display including a conductive frame; and a conductive spring that couples the conductive frame to the conductive plate, wherein the conductive spring is bent about a first axis, a second axis parallel to the first axis, and a third axis non-parallel with respect to the second axis.

20. The electronic device of claim 19, wherein the conductive spring comprises:

a first portion extending from the conductive plate to the first axis;

a second portion extending from the second axis to the third axis;

a third portion extending from the third axis to the conductive frame, the third portion being bent at an angle between 0 and 90 degrees with respect to the second portion; and at least one notch in the third portion and extending along a longitudinal axis of the third portion.

\* \* \* \* \*